United States Patent
Joo et al.

(10) Patent No.: US 6,818,506 B2
(45) Date of Patent: Nov. 16, 2004

(54) METHOD OF FORMING A GATE ELECTRODE IN A SEMICONDUCTOR DEVICE

(75) Inventors: Kwang Chul Joo, Yongin-shi (KR); Cha Deok Dong, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 9 days.

(21) Appl. No.: 10/284,472

(22) Filed: Oct. 31, 2002

(65) Prior Publication Data

US 2003/0124825 A1 Jul. 3, 2003

(30) Foreign Application Priority Data

Dec. 29, 2001 (KR) .......................................... 2001-87984

(51) Int. Cl.[7] .......................................... H01L 21/336
(52) U.S. Cl. ........................ 438/257; 438/305; 438/268
(58) Field of Search ............................... 438/257, 305, 438/585, 592, 268

(56) References Cited

U.S. PATENT DOCUMENTS

| | | | | |
|---|---|---|---|---|
| 4,693,782 A | * | 9/1987 | Kikuchi et al. | 438/365 |
| 5,120,673 A | * | 6/1992 | Itoh | 438/304 |
| 5,480,830 A | * | 1/1996 | Liao et al. | 438/199 |
| 5,652,166 A | * | 7/1997 | Sun et al. | 438/229 |
| 5,877,074 A | * | 3/1999 | Jeng et al. | 438/592 |
| 6,054,359 A | * | 4/2000 | Tsui et al. | 438/385 |
| 6,117,755 A | * | 9/2000 | Kun-Yu et al. | 438/592 |
| 6,127,712 A | * | 10/2000 | Wu | 438/287 |
| 6,153,469 A | * | 11/2000 | Yun et al. | 438/257 |
| 6,222,201 B1 | * | 4/2001 | Liu et al. | 438/268 |
| 6,326,261 B1 | * | 12/2001 | Tsang et al. | 438/243 |
| 6,417,099 B1 | * | 7/2002 | Tsai et al. | 438/647 |
| 6,596,599 B1 | * | 7/2003 | Guo | 438/305 |

FOREIGN PATENT DOCUMENTS

| | | |
|---|---|---|
| KR | 2001-0008559 | 2/2001 |
| KR | 2001-0059611 | 7/2001 |

* cited by examiner

*Primary Examiner*—John F. Niebling
*Assistant Examiner*—Walter L. Lindsay, Jr.
(74) *Attorney, Agent, or Firm*—Piper Rudnick LLP

(57) ABSTRACT

The present invention relates to a method of forming a gate electrode in a semiconductor device. Upon deposition processes for forming doped and undoped polysilicon films constituting a gate electrode, the deposition processes are performed at different temperatures. Thus, generation of an alien substance on the surface of the doped polysilicon film can be prohibited. As a result, the gate electrode having no defect can be implemented.

12 Claims, 2 Drawing Sheets

METHOD OF FORMING A GATE ELECTRODE IN A SEMICONDUCTOR DEVICE

BACKGROUND OF THE INVENTION

1. Field of the Invention

The invention relates generally to a method of forming a gate electrode in a semiconductor device, more particularly, to a method of forming a polysilicon film used as a gate electrode of a cell transistor in a flash memory being a non-volatile memory device.

2. Description of the Prior Art

A cell transistor in a flash memory device being a non-volatile memory device has a tungsten silicide ($WSi_x$) film as a gate electrode stacked in a polysilicon film in order to increase an operating speed of the device. At this time, a doped polysilicon film into which a dopant P (phosphorous) is in-situ implanted is employed in order to use the polysilicon film as the gate electrode.

Meanwhile, after the doped polysilicon film is deposited, an oxide film formed on the surface of the doped polysilicon film is removed to lower an interfacial resistance between the doped polysilicon film and the $WSi_x$ film upon a subsequent process of depositing $WSi_x$. At this time, as shown in FIG. 1, the surface of the polysilicon film from which the oxide film is removed has a hydrophobic property. The doped polysilicon film used as the gate electrode is changed from the hydrophobic property to the hydrophilic property as the concentration of 'P' used as a dopant is increased. As the oxide film is removed from the surface of the doped polysilicon film, however, the doped polysilicon film has a medium state between the hydrophobic property and the hydrophilic property that is not completely the hydrophilic property. As such, as a watermark can easily occur at the doped polysilicon film having the medium state between the hydrophobic property and the hydrophilic property as shown in FIG. 2, the watermark is generated at the interface between the doped polysilicon film and the $WSi_x$ film. This watermark causes to degrade a characteristic of the semiconductor device.

In order to solve the above problem, as shown in FIG. 3, a technology for preventing generation of the watermark has recently been employed by which the surface of the polysilicon film from which the oxide film is removed becomes the hydrophobic property by means of a cleaning process, by stacking a doped polysilicon film 10a and an undoped polysilicon film 10b at a given ratio instead of the doped polysilicon film 10a used as a control gate electrode 10 and forming an interface contacting to the $WSi_x$ film 20 using the undoped polysilicon film 10b.

The polysilicon film formed thus has a deposition temperature ranging from 530 to 570° C. in order to obtain a grain size of the polysilicon film that can be suitably used as the gate electrode. At a temperature below 530° C., there is a possibility that the grain size of the polysilicon film is abnormally grown in the process of depositing the doped polysilicon film and the undoped polysilicon film. If the grain size is abnormally grown, the gate dielectric film or the oxide film may be damaged to degrade an operating performance of the transistor. Further, at a temperature over 570° C., the growth of HSG (hemi spherical grain) is activated in the process of depositing the undoped polysilicon film after the doped polysilicon film is deposited. This causes a severe curve at the interface of the polysilicon film to lower an adhesive force with the $WSi_x$ film. As a result, there is a problem that the polysilicon film may not be used as the electrode.

However, at a deposition temperature of 530 through 570° C. for forming the polysilicon film having an adequate grain size, 'P' is precipitated into the grain boundary of an underlying doped polysilicon film upon the process of depositing the undoped polysilicon after the doped polysilicon film is deposited. As this precipitation point serves as a seed, the seed is abnormally grown. Due to this, a given alien substance is formed on the surface of the polysilicon film. As this alien substance serves as a defect in a subsequent process, the progress of the process and an operation of the device are adversely affected to reduce the yield.

SUMMARY OF THE INVENTION

The present invention is contrived to solve the above problems and an object of the present invention is to provide a method of forming a gate in a semiconductor substrate capable of preventing generation of an alien substance on the surface of a doped polysilicon film to implement a gate electrode without any defect, in a way that deposition processes for forming doped and undoped polysilicon films constituting a gate electrode are performed at difference temperatures.

In order to accomplish the above object, a method of forming a gate electrode in a semiconductor device having a structure in which a doped polysilicon film and an undoped polysilicon film are stacked on a semiconductor substrate according to the present invention, is characterized in that the doped polysilicon film and the undoped polysilicon film are deposited at different temperatures.

Further, a method of forming a gate electrode in a semiconductor device according to the present invention, is characterized in that it comprises the steps of forming a gate oxide film on a semiconductor substrate; forming a floating gate electrode on the gate oxide film; forming a dielectric film on the floating gate electrode; depositing a doped polysilicon film and an undoped polysilicon film on the dielectric film at different temperatures to form a control gate of a stack structure; and forming a silicide layer on the undoped polysilicon film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Referring now to FIG. 4A through FIG. 4D, a method of forming a gate electrode in the semiconductor device according to a preferred embodiment of the present invention will be below described.

Figure 1:
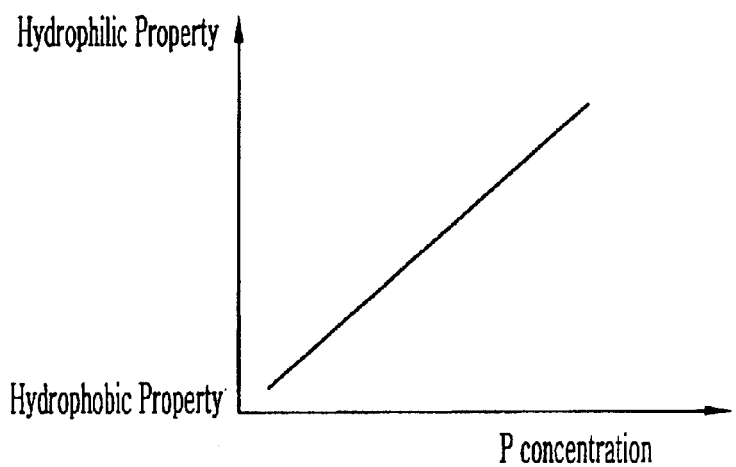
FIG. 1 shows a characteristic graph of a doped polysilicon film according to the concentration of a dopant 'P'.
Figure 2:
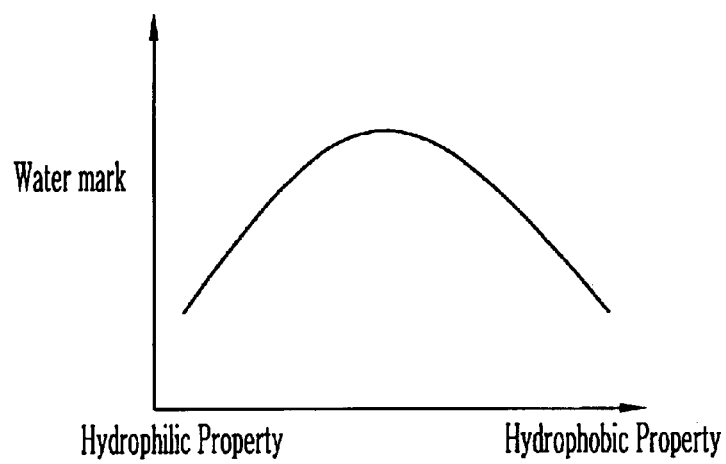
FIG. 2 shows a characteristic graph of the surface of doped polysilicon according to the characteristic of the doped polysilicon film shown in FIG. 1.
Figure 3:
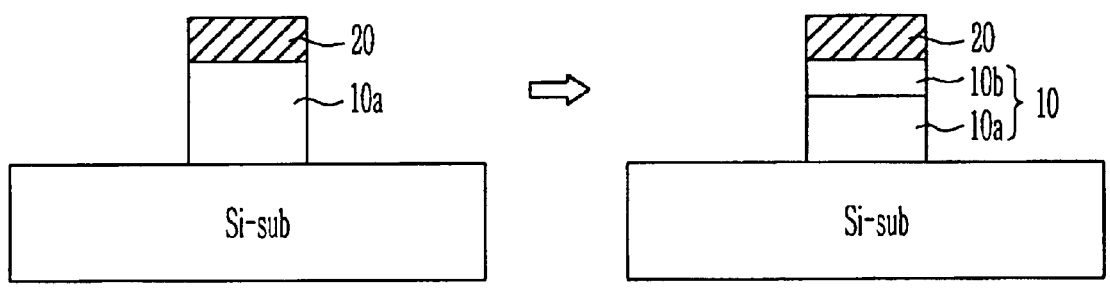
FIG. 3 is a cross-sectional view of a semiconductor device for explaining a conventional method of forming a gate electrode in the semiconductor device.
Figure 4A:
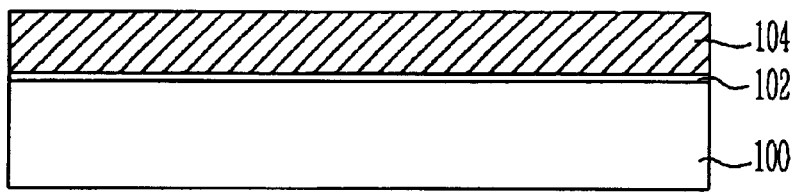
FIG. 4A through FIG. 4D are cross-sectional views of semiconductor devices for explaining a method of forming a gate electrode in the semiconductor device according to a preferred embodiment of the present invention.

Referring first to FIG. 4A, a native oxide film ($SiO_2$) formed on the surface of a semiconductor substrate 100 is removed by a surface processing process using HF vapor or HF solution. Next, a gate oxide film 102 is deposited on the surface from which the native oxide film ($SiO_2$) is removed.

Meanwhile, in order to clean the surface of the semiconductor substrate 100 or improve the uniformity of the surface of the semiconductor substrate 100 before/after the surface processing process, a pre-processing cleaning process using a compound such as $NH_4OH$ solution, $H_2SO_4$ solution, etc. is performed for the surface of the semiconductor substrate 100.

Thereafter, a doped polysilicon film 104 for a floating gate being a charge storage electrode is deposited on the gate oxide film 102. At this time, the doped polysilicon film 104 is deposited in thickness of 500 through 2000 Å under a pressure of 0.1 through 3.0 Torr at a temperature ranging from 550 to 620° C. using silicon (Si) source gas such as $SiH_4$ or $Si_2H_6$ and $PH_3$ gas.

Figure 4B:
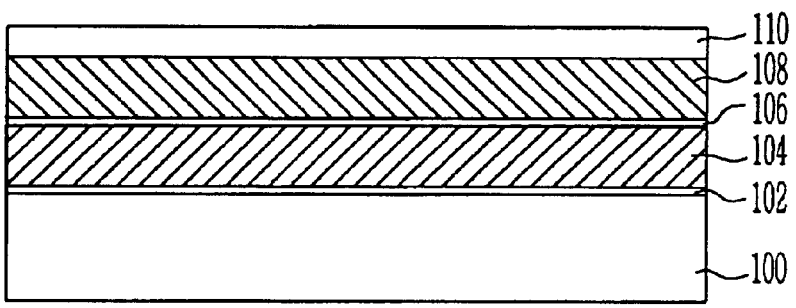

Referring now to FIG. 4B, a dielectric film 106 is deposited on the doped polysilicon film 104. At this time, the dielectric film 106 is deposited to have an oxide/nitride/oxide (ONO) structure or an oxide/nitride/oxide/nitride (ONON) structure in which an oxide film and a nitride film are deposited in a given thickness by means of a surface chemical reaction or deposited using a Ta-series metal oxide film.

Next, a doped polysilicon film 108 for a control gate in the memory cell is deposited on the dielectric film 106 by a low pressure-chemical vapor deposition (LP-CVD) method. An undoped polysilicon film 110 is then formed on the doped polysilicon film 108 with no time delay.

At this time, the doped polysilicon film 108 is deposited in thickness of 500 through 1500 Å under a pressure of 0.1 through 3.0 Torr at a temperature ranging from 530 to 570° C. using a silicon (Si) source gas such as $SiH_4$ or $Si_2H_6$ and a $PH_3$ gas so that it can have an adequate grain size. Also, the undoped polysilicon film 110 is in-situ deposited in thickness of 500 through 1000 Å under a pressure of 0.1 through 3.0 Torr at a temperature ranging from 480 to 520° C. using only a silicon (Si) source gas such as $SiH_4$ or $Si_2H_6$ while the $PH_3$ gas is not supplied after the doped polysilicon film 108 is deposited.

At this time, in order to in-situ batch-process the doped polysilicon film 108 and the undoped polysilicon film 110 within the same chamber, the doped polysilicon film 108 is deposited at a temperature ranging from 530 to 570° C. and the undoped polysilicon film 110 is then deposited at a temperature ranging from 480 to 520° C. after the deposition temperature of the chamber is lowered to a fall rate of about 1 through 10° C./min. As a result, the doped polysilicon film 108 having an adequate grain size could be formed and precipitation of a dopant 'P' can be prohibited by maximum. Therefore, an abnormal growth of the doped polysilicon film 108 generated due to a precipitation point of 'P' as a seed can be prohibited by maximum.

Figure 4C:
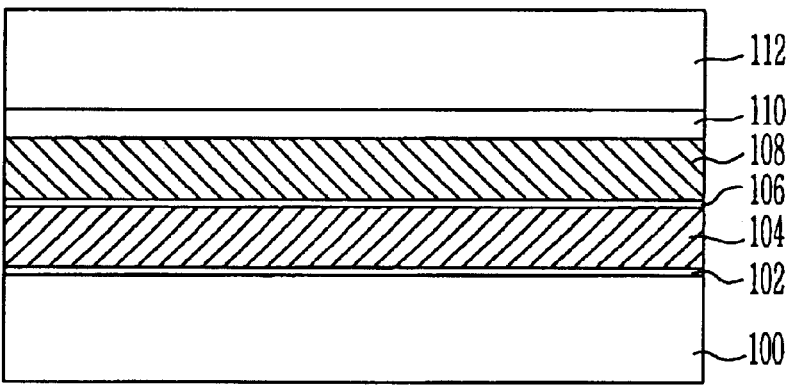

Referring now to FIG. 4C, the surface processing process using HF vapor, HF solution or BOE (buffer oxide etchant) (solution in which HF and $NH_4F$ are mixed at a ratio of 100:1 or 300:1) is performed to remove the native oxide film ($SiO_2$) formed on the surface of the undoped polysilicon film 110. Next, in order to increase the operating speed of the device, $WSi_x$ 112 is deposited on the surface from which the native oxide film ($SiO_2$) is removed. At this time, $WSi_x$ 112 is deposited by a surface chemical reaction of $SiH_4$ being a reaction gas and $WF_6$ within the LP-CVD chamber, thus making the composition ratio of 'x' about 2.0 through 3.0.

Figure 4D:
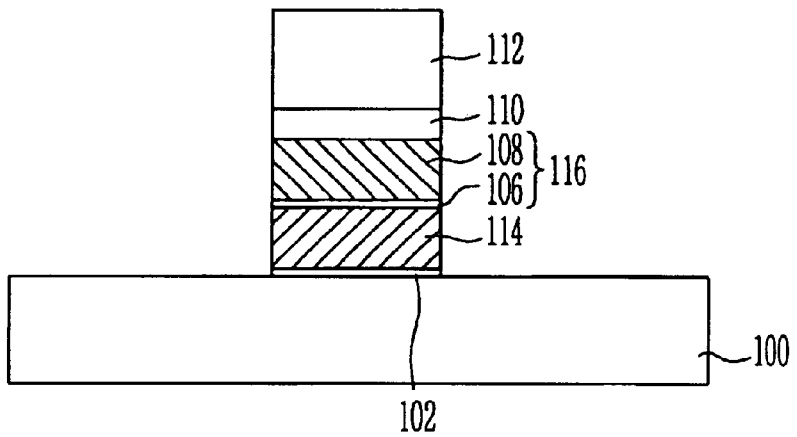

By reference to FIG. 4D, a given photoresist is deposited on the entire structure. An exposure and development process is then performed to form a photoresist pattern (not shown) for forming a gate pattern of the memory cell.

Next, $WSi_x$ 112, the undoped polysilicon film 110, the doped polysilicon film 108, the dielectric film 106, the doped polysilicon film 104 and the gate oxide film 102 are sequentially etched by an etch process using the photoresist pattern as a etch mask, thus forming a control gate 116 and a floating gate 114.

As described above, the deposition processes for forming the doped and undoped polysilicon films constituting the gate electrode are performed at different temperatures. Thus, the doped polysilicon film can be formed with no any defect.

According to the present invention, the deposition processes for forming the doped and undoped polysilicon films constituting the gate electrode are performed at different temperatures. Therefore, the present invention has advantages that it can prevent generation of an alien substance on the surface of the doped polysilicon film and the gate electrode can be thus implemented with no any defect. As a result, an electrical characteristic of a transistor can be improved since a factor affecting an operation of a semiconductor device is removed.

Further, according to the present invention, as the processes for depositing the doped and undoped polysilicon films are in-situ batch-processed without performing them separately, the number of the process can be reduced. As a result, processes for removing and detecting a defect can be skipped in a subsequent process. Therefore, the present invention has advantages that it can save the time of the entire process for implementing the semiconductor device and reduce an economic loss such as additional cost due to additional processes.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a gate electrode in a semiconductor device comprising the steps of:

stacking a doped polysilicon film and an undoped polysilicon film on a semiconductor substrate; and depositing said doped polysilicon film and said undoped polysilicon film at different temperatures.

wherein said undoped polysilicon film is deposited at a lower temperature than the lowest temperature in the temperature range, at which said doped polysilicon film is deposited.

2. The method as claimed in claim 1, wherein said doped polysilicon film is deposited at a temperature ranging from 530 to 570° C. and said undoped polysilicon film is deposited at a temperature ranging from 480 to 520° C.

3. The method as claims in claim 2, wherein said doped polysilicon film is deposited in thickness of 500 through 1500 Å under a pressure of 0.1 through 3.0 Torr using a silicon source gas an a $PH_3$ gas.

4. The method as claimed in claim 2, wherein said undoped polysilicon film is deposited in thickness of 500 through 1000 Å under a pressure of 0.1 through 3.0 Torr using a silicon gas source.

5. The method as claimed in claim 1, wherein said undoped polysilicon film is deposited in-situ within the same chamber in a given deposition temperature after the temperature of the chamber is lowered at a fall rate of 1 through 10° C./min after the deposition of the doped polysilicon film.

6. A method of forming a gate electrode in a semiconductor device, comprising the steps of:
   forming a gate oxide film on a semiconductor substrate;
   forming a floating gate electrode on said gate oxide film;
   forming a dielectric film on said floating gate electrode;
   depositing a doped polysilicon film and an undoped polysilicon film on said dielectric film at different temperatures to form a control gate of a stack structure, wherein said undoped polysilicon film is deposited at a lower temperature than the lowest temperature in the temperature range, at which said doped polysilicon film is deposited; and
   forming a silicide layer on said undoped polysilicon film.

7. The method as claimed in claim 6, wherein said floating gate electrode is deposited in thickness of 500 through 1500 Å under a pressure of 0.1 through 3.0 Torr at a temperature ranging from 530 to 570° C. using a silicon source gas and a $PH_3$ gas.

8. The method as claimed in claim 6, wherein said doped polysilicon film is deposited at a temperature ranging from 530 to 570° C. and said undoped polysilicon film is deposited at a temperature ranging from 480 to 520° C.

9. The method as claimed in claim 8, wherein said doped polysilicon film is deposited in thickness of 500 through 1500 Å under a pressure of 0.1 through 3.0 Tory using a silicon source gas and a $PH_3$ gas.

10. The method as claimed in claim 8, wherein said undoped polysilicon film is deposited in thickness of 500 through 1500 Å under a pressure of 0.1 through 3.0 Torr using a silicon source gas.

11. The method as claimed in claim 6, wherein said undoped polysilicon film is deposited in-situ within the same chamber in a given temperature after the temperature of the chamber is lowered at a fall rate of 1 through 10° C./min after the deposition of the doped polysilicon film.

12. The method as claimed in claim 6, wherein said silicide layer is $WSi_x$ formed by a surface chemical reaction of $WF_6$ and $SiH_4$ reaction gases within a LP-CVD chamber, thus making the composition ratio of 'x' about 2.0 through 3.0.

* * * * *